United States Patent
Laudo

(10) Patent No.: US 8,969,705 B2
(45) Date of Patent: Mar. 3, 2015

(54) THERMOELECTRIC DEVICE AND THERMOELECTRIC GENERATOR

(75) Inventor: John S. Laudo, Hilliard, OH (US)

(73) Assignee: Battelle Memorial Institute, Columbus, OH (US)

( * ) Notice: Subject to any disclaimer, the term of this patent is extended or adjusted under 35 U.S.C. 154(b) by 968 days.

(21) Appl. No.: 12/672,044

(22) PCT Filed: Aug. 4, 2008

(86) PCT No.: PCT/US2008/072104
§ 371 (c)(1),
(2), (4) Date: Feb. 3, 2010

(87) PCT Pub. No.: WO2009/029393
PCT Pub. Date: Mar. 5, 2009

(65) Prior Publication Data
US 2011/0120516 A1      May 26, 2011

Related U.S. Application Data

(60) Provisional application No. 60/963,224, filed on Aug. 3, 2007, provisional application No. 60/963,267, filed on Aug. 3, 2007.

(51) Int. Cl.
*H01L 37/00* (2006.01)
*H01L 35/24* (2006.01)

(52) U.S. Cl.
CPC ........................... *H01L 35/24* (2013.01)
USPC ........................................... 136/236.1

(58) Field of Classification Search
CPC ......... H01L 35/00; H01L 35/12; H01L 35/22; H01L 35/24
USPC ....................... 136/205, 225, 236.1
See application file for complete search history.

(56) References Cited

U.S. PATENT DOCUMENTS

| | | |
|---|---|---|
| 4,488,943 A | 12/1984 | Skotheim |
| 4,510,076 A | 4/1985 | Lee et al. |
| 4,929,388 A | 5/1990 | Wessling et al. |
| 4,935,164 A | 6/1990 | Wessling et al. |
| 5,439,528 A | 8/1995 | Miller |

(Continued)

FOREIGN PATENT DOCUMENTS

| | | |
|---|---|---|
| JP | 2004087714 | 3/2004 |
| WO | WO2006001719 A | 1/2006 |

OTHER PUBLICATIONS

English machine translation of Shibata (JP 2004-087714), published Mar. 18, 2004.*

(Continued)

*Primary Examiner* — Jonathan Johnson
*Assistant Examiner* — Christina Chern
(74) *Attorney, Agent, or Firm* — Frank Rosenberg

(57) ABSTRACT

The invention describes a novel thermoelectric composite material containing electrically conductive polymeric fibrils in a polymer matrix with a high thermoelectric coefficient. The invention also includes a thermoelectric device using the composite. The invention also includes a thermoelectric device containing a thermoelectric layers and a thermoelectric device in which a thermal barrier isolates a thermoelectric layer from a structurally supporting substrate. The thermoelectric devices can be used to generate electricity or to control temperature.

23 Claims, 2 Drawing Sheets

(56) References Cited

U.S. PATENT DOCUMENTS

| | | |
|---|---|---|
| 5,520,849 A | 5/1996 | Eiffler |
| 5,552,216 A | 9/1996 | Sugimoto et al. |
| 5,973,050 A | 10/1999 | Johnson et al. |
| 6,262,357 B1 | 7/2001 | Johnson et al. |
| 6,605,236 B1 | 8/2003 | Smith et al. |
| 6,741,019 B1 | 5/2004 | Filas et al. |
| 6,743,973 B2 | 6/2004 | Hayashi et al. |
| 6,759,587 B2 | 7/2004 | Toshima et al. |
| 7,248,461 B2 | 7/2007 | Takagi et al. |
| 2002/0132905 A1 | 9/2002 | Babinee et al. |
| 2004/0246650 A1 | 12/2004 | Grigorov et al. |
| 2005/0150537 A1 | 7/2005 | Ghoshal |
| 2005/0150539 A1 | 7/2005 | Ghoshal et al. |
| 2006/0048809 A1 * | 3/2006 | Onvural ............ 136/212 |

OTHER PUBLICATIONS

Harsanyi, Gabor. "Polymeric sensing films: new horizons in sensorics?"; Sensors and Actuators A 46-47 (1995) 85-88.*

U.S. Appl. No. 6/963,267, filed Aug. 3, 2007, Laudo.

U.S. Appl. No. 6/963,224, filed Aug. 8, 2007, Laudo.

PCT International Search Report from PCT/US2008/072104, mailed Aug. 4, 2008.

* cited by examiner

THERMOELECTRIC DEVICE AND THERMOELECTRIC GENERATOR

RELATED APPLICATIONS

This application is the national stage filing of and claims priority to PCT/US2008/072104 filed Aug. 4, 2008. Through the PCT application, this application claims the benefit of priority U.S. Provisional Patent Applications 60/963,267 and 60/963,224 both of which were filed on Aug. 3, 2007.

INTRODUCTION

Thermoelectric materials (which are materials that can generate a current when there is a temperature change through the material) and devices employing thermoelectric materials have been the subject of intense research for many years. For example, Miller in U.S. Pat. No. 5,439,528 describes describe thermoelectric devices containing alternating thin layers of p-type and n-type materials, such as alternating layers of lead telluride and lead selenide.

Johnson et al. in U.S. Pat. No. 5,973,050 describe a thermoelectric material formed of a composite of metal nanoparticles dispersed in a conductive organic polymer matrix.

Hayashi et al. in U.S. Pat. No. 6,743,973 describe a thermoelectric material comprising one type of material containing (Bi or Sb) and (Te and Se).

Toshima et al. in U.S. Pat. No. 6,759,587 describe a thermoelectric material formed of a composite of an inorganic thermoelectric material dispersed in an organic polymer matrix.

Johnson et al. in U.S. Pat. No. 6,262,357 describe thermoelectric devices containing alternating layers of p-type and n-type materials. Column 11 refers to several previous patents that describe various inorganic thermoelectric materials.

Ghoshal in US 2005/0150537 describes thermoelectric devices containing alternating layers of p-type and n-type materials such as $Bi_{0.5}Sb_{1.5}Te_3$ and $Bi_2Te_{3.2}$, respectively. Ghoshal et al. in US 2005/0150539 describe thermoelectric devices containing alternating thin layers of p-type and n-type materials. The end of page 6 refers to various inorganic thermoelectric materials which could be used in forming the device.

As described in detail in the following sections, the present invention includes a thermoelectric material that is a polymer/polymer composite. Although the following references do not concern thermoelectric materials, there are a plethora of prior publications that describe polymer blends that have been studied for their electric properties. For example, Skotheim in U.S. Pat. No. 4,488,943 describes a blend of a conductive polymer and a polymer electrolyte. The conductive polymer is preferably polypyrrole and the polymer electrolyte is preferably polyethylene oxide or polypropylene oxide. The blend is designed for use in electrochemical photovoltaic cells.

Lee et al. in U.S. Pat. No. 4,510,076 describe an electrically conductive polymer formed from a doped acetylene polymer and a triblock thermoplastic elastomer. The triblock elastomer could be styrene-isoprene-styrene.

Wessling et al. in U.S. Pat. No. 4,929,388 describe an electrically conductive material comprising a polymer blend and an electrically conductive additive. The conductive additive could be a variety of inorganic or organic substances including polyacetylene and polypyrrolene. The material can contain mixtures of several conductive additives.

Wessling et al. in U.S. Pat. No. 4,935,164 describe dispersions of conductive polymers in thermoplastic polymers. The electrically conductive polymers could include polypyrrole. The resulting material could be used to make electrically conductive molded articles.

Eiffler in U.S. Pat. No. 5,520,849 describes conductive polymeric composites such as sheath-core composites comprising a conductive polymer such as polypyrrole. The electrically conductive polymer is produced by oxidative polymerization.

Sugimoto et al. in U.S. Pat. No. 5,552,216 describe making an electrically conductive material by combining (meth)acrylate, an anilinic (derived from aniline) electrically conductive polymer, and a photoinitiator.

Smith et al. in U.S. Pat. No. 6,605,236 describe a conductive composite comprising a discrete phase of polypyrrole and a block copolymer continuous phase.

Filas et al. in U.S. Pat. No. 6,741,019 describe techniques of aligning nanowires. The nanowires are coated with a magnetic material. A slurry of the nanowires is placed in a long vertical tube and the magnetic nanowires are aligned in a gradient magnetic field. The speed of nanowire movement can be controlled by adjusting the strengths of the magnetic field and the gradient.

Takagi et al. in U.S. Pat. No. 7,248,461 described a blend of conductive polymers. One polymer is polypyrrole and the second polymer is an ionic polymer such as polyacrylic acid.

Babinee et al. in US 2002/0132905 describe polymers that are blended with a conductive additive. The conductive additive could be polypyrrole. The polymers can be made from a vinyl or vinylidene monomers and α-olefin monomers such as acrylic acid or methacrylic acid.

Grigorov et al. in US 2004/0246650 describe methods of making electrically conductive polymers containing nanowires. At paragraph 132, the inventors state that conductive fibrils can be created by exposing the polymer to microwave power levels ranging from 100 W to 10 kW and that the power levels are pulsed to avoid overheating. Filtering is mentioned as a method of enriching the concentration of fibrils, and a fluid containing the fibrils can be forced from a syringe through a filter. In the example (page 18), a conductive film is treated with alternating voltage for 10 days.

Belcher et al. in WO 2006/001719A1 describe the production of polymer filaments by electrospinning a composition comprising a monomer such as pyrrole, an oxidant and a polymer such as polymethylmethacrylate (PMMA). The fibers are stated to be useful for molecular wires.

SUMMARY OF THE INVENTION

The invention provides a thermoelectric composite material, comprising: conductive organic fibrils, and a polymer with a high Seebeck coefficient of at least 40 microvolts per degree Celsius (µV/C); wherein the conductive organic fibrils are dispersed in the polymer with the high Seebeck coefficient. Preferably, the fibrils are anisotropically oriented in the polymer, and preferably this orientation is in the direction of the intended flow of electrical current.

The invention also includes a thermoelectric device that includes the thermoelectric composite material described above in electrical contact with an electrode.

In another aspect, the invention provides a method of making an organic conductive fibril comprising: passing a solution comprising a monomer or oligomer through a tube; polymerizing the monomer or oligomer in the tube in the presence of an electric or magnetic field; and collecting the polymeric fibrils on a filter connected to an end of the tube.

In a further aspect, the invention provides a thermoelectric device, comprising: a first electrode; plural, alternating layers comprising at least two layers of a polymeric thermoelectric material, alternating with at least two layers of an electrically conductive layer; and a second electrode. The plural alternating layers are disposed between the first and second electrodes. In a preferred embodiment, the polymeric thermoelectric material comprises the thermoelectric composite described above.

In another aspect, the invention provides a thermoelectric device comprising: a first electrode electrically connected to a first side of a thermoelectric layer; a second electrode electrically connected to a second side; a supporting substrate; and a thermal barrier. The thermal barrier is disposed between the supporting substrate and the thermoelectric layer. The thermoelectric layer comprises a polymeric thermoelectric material having a Seebeck coefficient of at least 40 microvolts per degree Celsius (µV/C). The thermoelectric layer is in the form of a thin layer having a height of 1 mm or less and having a high aspect ratio such that width is at least 10 times greater than height and length is at least 10 times greater than height, and the first and second electrodes are disposed at opposite sides of the thermoelectric layer along the length direction of the thermoelectric layer. Preferably, the thermal barrier comprises voids.

In any of the thermoelectric devices, there may be a thermal collector that is thermally connected to the same side of the thermoelectric composite layer to which the first electrode is connected. In embodiments in which the thermoelectric layer comprises a composite with conductive fibrils, the conductive organic fibrils are preferably anisotropically oriented with a disproportional number of fibrils aligned in the direction that is parallel to the direction in which electricity passes through the thermoelectric layer. In any of the thermoelectric devices, the thermoelectric material can be in the form of a thin layer having a height of 1 mm or less and having a high aspect ratio such that width is at least 10 times greater than height and length is at least 10 times greater than height; and wherein first and second electrodes are disposed at opposite sides of the thermoelectric layer along the length that is parallel to conduction through the material.

The invention also includes methods of using any of the thermoelectric devices described herein, comprising: exposing the thermoelectric device to a temperature gradient to generate electricity; or exposing the thermoelectric device to an electric potential to heat or cool a substrate.

By incorporating quantum 1-dimensional organic conductive structures into a conductive polymer, a new material of higher conductivity and improved figure-of-merit (ZT) for thermoelectric applications can be formed. The composite material will have higher electrical conductivity and an improved figure-of-merit as a thermoelectric device than the base host material alone, by virtue of the increased ability for electrons to transit the material more efficiently and due to the conduits provided by the 1-dimensional conductors. An added benefit of the polymer-polymer composite is that two similar materials, as far as molecular weight, density, thermal conductivity, structure, will form a more robust final material than a metal-polymer thermoelectric composite (such as in U.S. Pat. No. 5,973,050 to Johnson). An all-polymer material may have more uniform thermal conductivity across the device, and more uniform distribution of stress and strain on a localized domain level. The localized stress and strain from dissimilar materials causes performance limitations in thermoelectric metal-polymer composites.

An all polymer thermoelectric material also avoids the need to mine heavy metals such as BiTe, and secondly, the inherent environmentally friendly nature of the material which allows for a wide spread proliferation of the technology without environmental risks. Because the figure of merit can surpass current technologies at room temperature, even more technical applications can be envisioned using lower output energy heat sources. For example, instead of requiring the use of high temperature sources such as car engines or furnaces, this lower temperature solution can offer the ability to harvest energy from those sources as well as lesser output heat sources such as solar thermal energy which uses the absorbed energy of the sun as a heat source. Other sources such as body heat, the thermal emission from computer chip processors in laptops and personal computers, could also be envisioned as likely candidates for a low temperature thermal conversion technology such as this one.

GLOSSARY

"Aligned" fibrils refers to fibrils anisotropically dispersed in a matrix such that at least 40% of the fibrils are aligned principally in one direction (this is compared to an isotropic material, in which one third of the fibrils would be aligned principally in each of the three directions that define three-dimensional Euclidean space). More preferably, aligned fibrils are dispersed such that at least 70% of the fibrils are aligned principally in one direction; and still more preferably dispersed such that at least 90% of the fibrils are aligned principally in one direction.

"Conductive organic fibrils" are highly conductive polymeric materials having a high aspect ratio of at least 5 of length compared to either width or height. These fibrils are described in detail by Grigorov et al. in U.S. Patent Publication No. 2004/0246650A1 which is incorporated herein by reference, as if reproduced in full below. The fibrils have a conductivity of at least $10^6$ Siemen per centimeter (S/cm). In a composite with a second polymer, the fibrils may be identified by techniques such as scanning electron microscopy (SEM) and atomic force microscopy (AFM) which can measure conductivity of the fibrils within the composite. The polymeric materials contain C—H and C—C bonds and/or siloxane groups, and may contain other linkages such as C—O—C. These polymeric materials are not carbon sheets such as carbon nanotubes (CNTs), nor are they modified CNTs; nor are they metal filaments.

An "electrically conductive" material has a conductivity of at least $10^5$ S/cm, preferably at least $2 \times 10^5$ S/cm. Preferred examples of electrically conductive materials include copper and gold.

A "high Seebeck coefficient" is a Seebeck coefficient of at least 40 microvolts per degree Celsius (µV/C).

A "temperature gradient" is a temperature difference of at least 1° C. at two ends of a thermoelectric device.

All properties, including conductivity and Seebeck coefficient, are to be measured at 293 K (20° C.) unless specified otherwise. These properties can be measured using standard techniques such as the Harman method and 3ω method as outlined by Tritt in chapter 23 of the Handbook of Thermoelectrics (CRC press, DM Rowe editor, 2006).

DETAILED DESCRIPTION

Figure 1:
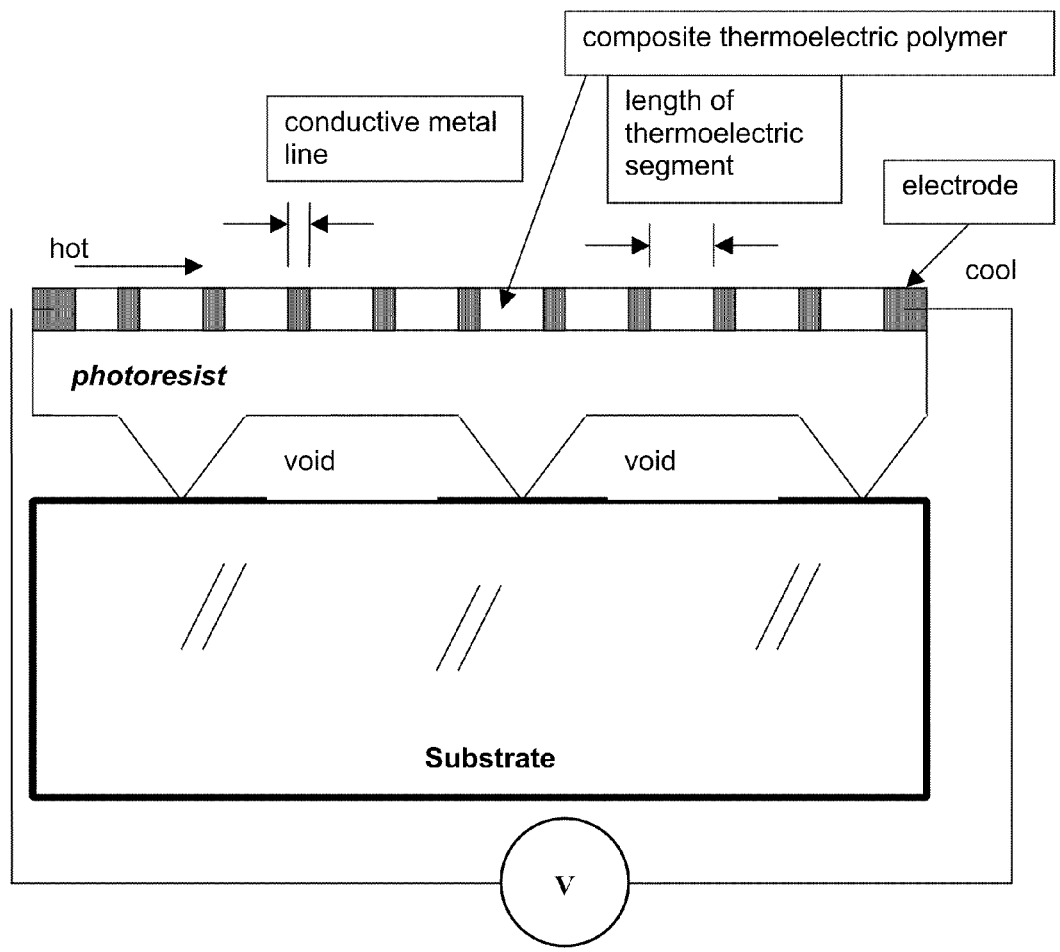
FIG. 1 is a schematic illustration of a side view of a thermoelectric device showing alternating rows of thermoelectric material and conductive material.

The conductive organic fibrils are described by Grigorov et al. in U.S. Patent Publication No. 2004/0246650A1, and Aldissi in U.S. Pat. No. 7,097,757, both of which are incorporated herein by reference, as if reproduced in full below. As described by Aldissi, the conductive fibrils can be formed by electrochemical polymerization of methacrylate to form conductive fibrils of polymethacrylate. An improvement of this process may employ oligomeric units having molecular weights in the range of 100-1000 amu, which are then processed in the presence of an electric or magnetic field, and then formed into crystalline structures. During or after synthesis of the high aspect ratio polymers, a strong intermittent or pulsed external field (electrical or magnetic) would significantly aid the process by providing a repeated alignment mechanism to the fibrils in solution.

The conductive organic fibrils described by Grigorov et al. in U.S. Patent Publication No. 2004/0246650A1 are comprised of at least 50 volume % of molecules having molecular weights of at least 2 kDa, or at least 15 kDa, or at least 300 kDa. The macromolecular material used to make the conductive fibrils include, but is not limited to, materials containing a significant percentage of hydrocarbons, polyurethanes, silicon-oxygen based polymers, biological polymers, copolymers, homopolymers, terpolymers, block polymers, polymer gels, polymers containing plasticizing substances, or various mixtures thereof. This definition of macromolecular material is exclusive of pure metals, crystals, and ceramics, although this definition includes macromolecular materials that are doped or mixed with relatively small amounts of low molecular weight organic and inorganic substances, metal, crystal, ceramic, or other such materials. For purposes of the present invention, "conductive organic fibrils" include the siloxane polymers described by Grigorov et al. The starting polymeric material is activated by a treatment such as exposure to UV radiation, sputtering or spraying an ionizing the droplets, ion implantation such as from an ionic plasma, and contact charging. The starting material can also be doped with an alkali metal, a lanthanide, or a 3d transition metal. The fibrils are purified (or, alternatively termed, "enriched") by a technique such as: high performance liquid chromatography (HPLC), size exclusion chromatography (SEC), disc centrifuge photodensitometer (DPC), capillary hydrodynamic fractionation (CHDF), field flow fractionation (FFF), electrophoresis, dielectrophoresis, applying an electric or magnetic filed to a powdered solid, filtering, centrifuging, or precipitating. The fibrils have a conductivity greater than $10^6$ S/cm, preferably greater than $10^7$ S/cm, and most preferably greater than $10^8$ S/cm.

In the thermoelectric composite, the host polymer is a polymer with a high Seebeck coefficient such as poly-octylthiophene, polypyrrole, polythiophene, poly(3-alkylthiophenes), polyaniline, poly(3,6-hexyl-2,7,N-octylcarbazole), poly(diindolocarbazole), Poly(2,5-dimethoxyphenylenevinylene), polyacetylene, their derivatives or other conductive polymers which have large Seebeck coefficients (greater than 40 microvolts per degree Kelvin, in some embodiments 40 to 1800 microvolts per degree Kelvin, and in some embodiments 40 to 1200 microvolts per degree Kelvin) as part of their electrical characteristics.

Prior art techniques for forming polymeric composite materials can be employed to make the inventive thermoelectric material from the mixture of conductive organic fibrils and a high Seebeck coefficient polymer. For example, by dissolving the host polymer in an appropriate solvent (e.g., toluene, DMSO) and blending or dispersing the fibrils into the host, then curing and/or evaporating the solvent, a solid matrix thermoelectric material could be formed.

Further, by polymerizing and/or purifying the fibrils in a long column (preferably at least 1 cm, more preferably at least 10 cm, and in some embodiments in the range of 10 to 40 cm), significant time and opportunity can be given for the nanowires to orient themselves, bind and crystallize, increase their dimensions and transit to a micropore filter stage. An external electric field can assist the binding and crystallization process by preferentially orienting the fibrils in the column. The greater the field strength, length of travel and time to travel, the greater the yield of the crystalline polymer at the end filter stage. Pore size and cross-sectional area of the filter can be optimized to increase yield without significantly reducing flow.

Thermoelectric materials of this invention preferably are composite materials comprising at least two types of polymeric material; the first type of polymeric material is a conductive organic fibril and the second type of material is an organic polymeric material that has a high Seebeck coefficient. Although transition metals may be present in dopant amounts; preferably the composite material is free of transition metal particles and free of particles of semimetal particles (such as Sn, Si, Al, Tb, Bi, Sb, Ga, In, Ge, Te), and preferably comprises less than 5 weight % transition metals and semimetals, more preferably less than 1 weight % transition metals and semimetals, and in some embodiments less than 0.1 weight % transition metals and semimetals.

Within the polymeric matrix, the conductive organic fibrils can be singular or in bundles. Preferably, the composite material comprises at least 1 volume % conductive fibrils, more preferably at least 4 volume % conductive fibrils; in some embodiments between 1 and 4 volume % conductive fibrils, and in some embodiments between 4 and 30 volume % conductive fibrils.

Since the electrical conductivity of the organic fibrils can approach or exceed that of copper ($10^7$ S/meter) the electrical conductivity of the composite material can have a high electrical conductivity as well with at least $10^3$ S/meter for high figure of merit composites. Simultaneously, the thermal conductivity is preferably maintained at a value of 0.2 Watt/meter-Kelvin or less, as the added fibrils are formed from similar materials as the host matrix. It is contemplated that the Seebeck coefficient of the composite may be about ½ of the original value (1800 uV/dT) of the host polymer, in some embodiments the composite has a Seebeck coefficient of at least 800 uV/dT. Neglecting thermal shunting, the resulting composite will have a figure of merit (ZT) in greater than 3.0, which is significantly higher than other polymer thermoelectric systems at room temperature (293 K).

The inventive thermoelectric material can be employed in any known thermoelectric device to either generate electricity in the presence of a thermal gradient or to employ an electrical potential to control temperature. For generating electricity, the thermal gradient is at least 1° C., more preferably at least 3° C., and in some embodiments at least 10° C.

An inventive thermoelectric device is illustrated in FIG. 1. In the figure, the temperature gradient is from hot on the left to cool on the right. The dark bars are bars of a conductive material, preferably a metal such as copper or gold. The conductivity of the conductive bars and the electrodes is at least $1 \times 10^6$ S/m at 293 K, preferably at least $30 \times 10^6$ S/m at 293 K. The conductive bars are preferably narrow, preferably 100 nm or less, more preferably 50 nm or less, and in some embodiments between 10 and 40 nm, and are typically approximately rectangular. The space between the bars of conductive material is filled by a thermoelectric material, preferably an organic thermoelectric material, and most preferably the thermoelectric composite material that is described above. The space between bars is preferably 1 µm (micrometer) or less, more preferably less than 300 nm, and in some embodiments in the range of 20 to 200 nm. Preferably, conductive fibrils (if present) are aligned such that they help to span the individual lanes of polymer in the device, and increase the electrical conductivity of the system on a lane by lane basis. It is contemplated that the fibrils could be aligned by applying an electric field during or after the application of applying the thermoelectric material between the conductive lines; for example, during a spray or annealing step. In some embodiments, the thermoelectric composition is disposed both between the conductive lines and on the tops of the conductive lines (this could be pictured as snow fallen between and on top of the rows of conductive bars). Electrodes are disposed on either end of the thermoelectric device. Preferably, the electrodes are made of gold or silver or other highly conductive material with minimizes the potential barrier between the electrode and the polymer material.

A thermal barrier, such as a photoresist layer, which could be fabricated using SU-8 Microchem material, reduces thermal shunting of heat into the substrate, preferably the thermal barrier prevents more than 50%, more preferably prevents more than 80% of heat that is transferred through the thermoelectric layer, from passing (shunting) into the substrate. The thermal barrier is composed most preferably of a low thermal conductivity material with a thermal conductance k of about 0.2 W/meter-Kelvin or less. The thermal barrier is preferably structured to contain voids, to further reduce thermal conduction to the substrate. In addition, the thermal barrier is preferably fabricated with a geometry which further reduces the ability to transfer heat to the substrate by reducing the cross-sectional area of the thermal barrier that is in contact with the support; an example of this is shown in FIG. 1. In some preferred embodiments, the ratio of cross-sectional area of the thermal barrier that is in contact with the thermoelectric layer divided by the cross-sectional area of the thermal barrier that is in contact with the support is 0.5 or less, more preferably 0.2 or less, and still more preferably 0.1 or less. The height of the thermal barrier is preferably 200 µm or less, in some embodiments 10 to 100 µm. The voids in the thermal barrier, if present, preferably extend from the surface of the structural support to up to 90% of the height of the thermal barrier, some embodiments 50 to 85% of the height of the thermal barrier. The "height" refers to the direction up the page in FIG. 1, and is perpendicular to current flow through the thermoelectric layer. The length direction refers to the direction of current flow through the thermoelectric material and is left to right in FIG. 1 and top to bottom in FIG. 2. The angle of the tapered voids can be about 45 degrees as shown in FIG. 1, but a range of angles are possible in the fabrication and can be changed in conjunction with the spacing or pitch of the structures to provide the same level of support to the thermoelectric layer. In addition, the thermal barrier structure can be lanes which run parallel to the metal lanes in the thermoelectric layer, or they can be columnar pillars. The preferred embodiments reduce the mass in the thermal barrier layer and subsequently the contact area with the substrate to minimize heat transport to the substrate. The voids in the thermal barrier can be a vacuum, air-filled or inert gas-filled. For a thermoelectric layer with alternating rows of thermoelectric and electrically conductive material, there are at least two rows of thermoelectric alternating with two rows of conductive, preferably at least 5 alternating rows of each, more preferably at least 50 rows of each.

The electrode-to-electrode length of a thermoelectric layer is preferably in the range of 0.1 mm to 1 cm, in some embodiments at least 0.5 mm. The width of the thermoelectric layer (the direction into the page in FIGS. 1 and 2) can be adapted to the desired use; in some embodiments the width is in the range of 0.1 mm to 10 cm, in some embodiments at least 2 mm. The length and width of the thermal barrier is preferably the same or similar to that of the thermoelectric layer, and can have the same preferred ranges.

The support substrate in FIG. 1 provides structural support to the thermoelectric film. The support substrate is preferably not thermally conductive; preferably glass, polymer, ceramic or combinations thereof. The length and width of the support substrate is preferably the same or similar to that of the thermoelectric layer, and can have the same preferred ranges. The height of the support substrate should be sufficient to provide the desired strength to the thermoelectric layer and is preferably at least 1 mm, in some embodiments at least 5 mm.

Figure 2:
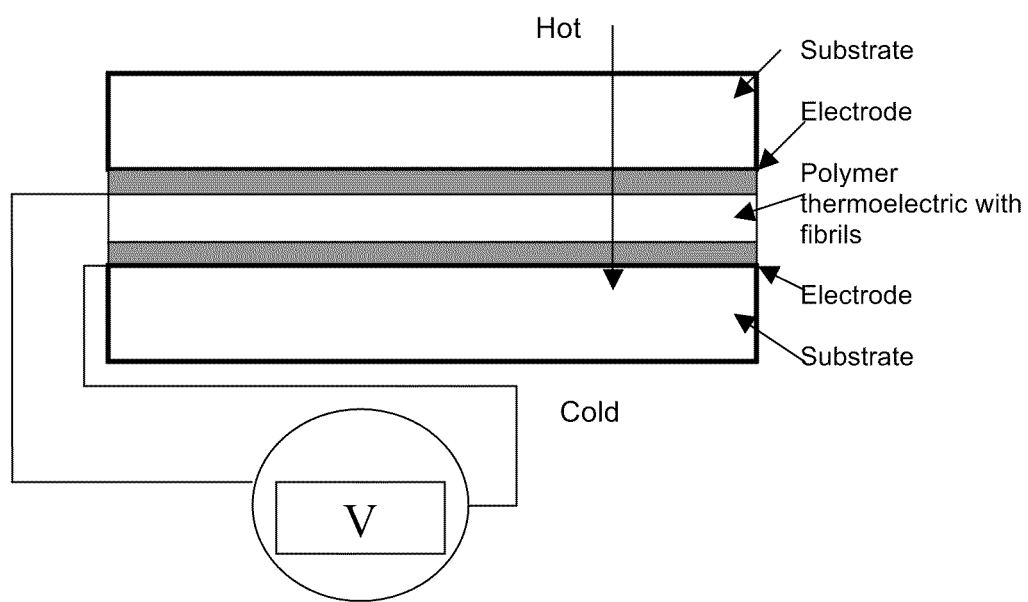
FIG. 2 is a schematic illustration of a side view of a thermoelectric device showing a sandwich stack where the heat flows through the device across a layer of the thermoelectric material which is between two planar electrodes.

Another embodiment of a thermoelectric device is illustrated in FIG. 2. In this figure, the temperature gradient is vertically transmitted across a single layer of the thermoelectric material, which is sandwiched between two planar electrodes. The electrodes are conductive; for example, gold with a thickness of 1 micron deposited on a glass, polymer or ceramic substrate. The thermoelectric material in this case is preferably between 10 to 30 microns thick with the conductive fibrils dispersed throughout the material. In the embodiment illustrated in FIG. 2, there are no conductive bars in the thermoelectric layer.

The hot and cold substrates in FIG. 2 can be any materials. In some embodiments there is one or no substrates (in which case there are only electrodes). If the substrate is electrically conductive, the electrode could be placed on the other side of the substrate. In one example, the hot substrate could be an engine block and the cold substrate a protective plastic shield. In another case, the hot substrate could be the surface of a computer chip.

Example of Purifying a Conductive Organic Fibril

Polymers having an ordered structural state, as produced by Aldissi (U.S. Pat. No. 7,097,757) serve as a base material for this example. In particular, Polymethacrylate films fabricated using Aldissi's method, can be dissolved in a solvent (toluene), then poled electrically or magnetically with an external field, and then cured to form crystalline polymer domains. It is also possible that the poling may not be necessary at all, if sufficient time is given to the liquid dissolved state for the one-dimensional conductors to link to each other or bundle. We performed the poling for this embodiment using strong magnetic field from a permanent magnet, which was placed under the solvated base material on a glass slide. The solvent was allowed to evaporate over a 40 minute period. The cured material was then redissolved in toluene, placed in a small pippette tip and pulled by vacuum through a 0.5-1 um pore membrane filter (Whatman). Particles larger than the pore size deposited on the surface of the membrane and were imaged by polarization microscopy. The images revealed birefringent crystals of polymethacrylate. In one case, a large 100 µm long crystal with uniform planes was viewed on the membrane surface.

Given sufficient time for alignment and bundling of nanowires, crystalline polymer material can be produced on a micro to macro scale. A strong intermittent or pulsed external field (electrical or magnetic) would significantly aid the process by providing a repeated alignment mechanism to the nanowires in solution.

Further, by poling as described, but now using a much longer glass column, significant time and opportunity could be given for the nanowires to orient themselves, bind and crystallize, increase their dimensions and transit to the micropore filter stage. The greater the field strength, length of travel and time to travel, the greater the yield of the crystalline polymer at the end filter stage. Pore size of the filter can be optimized further to increase yield without significantly reducing flow, by increasing the area of the pipette tip on the filter (previously~2 mm in diameter). Less than 0.5 ml was used of the base material in this harvesting process and larger quantities of base material could be processed yielding more crystalline polymer.

The procedure used in the experiments is detailed below:
(1) Verified that a PMA/toluene solution could be concentrated on a 2 mm diameter spot of a polyester membrane filter (100 nm). The polyester membrane filter is a track etch filter, so it has a smooth surface with well-defined pores. The polyester is PETE and has excellent resistance to organics.
(2) Prepared a solution of the nanowire enriched PMA in toluene. The mass of the PMA based on five measurements was 1.24+/−0.02 mg. The concentration of the solution was 1.14 wt % in toluene. The solution contained a lot of crud that was present on the surface of the PMA prior to dissolution. The crud included: black particles, black fuzz, glass-like rod, and other miscellaneous material.
(3) Prepared a control solution of PMA in toluene PMA from Aldrich, Mw 40,000 g/mol. Prepared solution with same concentration as above.
(4) Passed 0.12 g of control solution through polyester membrane filter using a polypropylene pipette tip to concentrate the to 2 mm diameter. Washed with 1 mL of toluene. Observation of the sample suggests that some of the polymer collected near the edges of the pipette tip. The middle appears bare.
(5) Repeated as above with sample. Results are similar with the exception that the crud is pretty evident.

What is claimed:

1. A thermoelectric composite material, comprising:
   conductive organic fibrils, and a polymer with a high Seebeck coefficient of at least 40 microvolts per degree Celsius ($\mu$V/C);
   wherein the organic fibrils have a conductivity of at least $10^6$ Siemen per centimeter (S/cm);
   wherein the conductive organic fibrils are dispersed in the polymer with the high Seebeck coefficient.

2. The thermoelectric material of claim 1 wherein the fibrils are anisotropically oriented in the polymer with the high Seebeck coefficient.

3. A thermoelectric device, comprising:
   the thermoelectric composite material of claim 1 in electrical contact with an electrode.

4. The thermoelectric device of claim 3 comprising:
   a first substrate;
   the electrode in thermal contact with the first substrate;
   the thermoelectric composite material of claim 1 in electrical contact with the electrode;
   a second electrode in electrical contact with the thermoelectric composite material;
   a second substrate in thermal contact with the second electrode; and
   an electrical circuit connecting the electrode and the second electrode.

5. The thermoelectric device of claim 4 comprising, in sequential order:
   the first substrate, the first electrode, the thermoelectric composite material, the second electrode, and the second substrate.

6. The thermoelectric device of claim 4, the thermoelectric composite material having a first side and an opposite second side, wherein the first electrode is directly adjacent to the first side and wherein the second electrode is directly adjacent to the second side.

7. The thermoelectric device of claim 4 comprising, in sequential order:
   the first electrode, the first substrate, the thermoelectric composite material, the second substrate, and the second electrode.

8. The thermoelectric device of claim 4 further comprising a supporting substrate and a thermal barrier, wherein the thermal barrier is disposed between the supporting substrate and the thermoelectric composite.

9. The thermoelectric device of claim 8 wherein the thermal barrier comprises voids.

10. The thermoelectric device of claim 8 wherein the thermoelectric composite is in the form of a thin layer having a height of 1 mm or less and having a high aspect ratio such that width is at least 10 times greater than height and length is at least 10 times greater than height; and wherein the electrode is a first electrode and comprising a second electrode, wherein the first and second electrodes are at opposite sides of the thermoelectric composite layer along the length direction of the thermoelectric composite layer.

11. The thermoelectric device of claim 10 further comprising a thermal collector that is thermally connected to the same side of the thermoelectric composite layer to which the first electrode is connected.

12. A method of using a thermoelectric device, comprising:
    exposing the thermoelectric device of claim 3 to a temperature gradient to generate electricity or an electric potential to heat or cool a substrate.

13. The thermoelectric material of claim 1 wherein the polymer with a high Seebeck coefficient has a Seebeck coefficient of 40 to 1800 microvolts per degree Kelvin ($\mu$V/K).

14. The thermoelectric material of claim 1 wherein the polymer with a high Seebeck coefficient has a Seebeck coefficient of 40 to 1200 microvolts per degree Kelvin ($\mu$V/K).

15. The thermoelectric material of claim 13 wherein the polymer with a high Seebeck coefficient comprises polyoctylthiophene, polypyrrole, polythiophene, poly(3-alkylthiophenes), polyaniline, poly(3,6-hexyl-2,7-N-octylcarbazole), poly(diindolocarbazole), Poly(2,5-dimethoxyphenylenevinylene), polyacetylene, or their derivatives.

16. The thermoelectric material of claim 13 wherein the conductive organic fibril comprises a siloxane polymer.

17. The thermoelectric material of claim 13 wherein the material comprises less than 1 weight % transition metals and semimetals.

18. The thermoelectric material of claim 13 wherein the material comprises less than 0.1 weight % transition metals and semimetals.

19. The thermoelectric material of claim 13 wherein the material comprises between 1 and 4 volume % conductive organic fibrils.

20. The thermoelectric material of claim 13 wherein the material comprises between 4 and 30 volume % conductive organic fibrils.

21. The thermoelectric material of claim 13 wherein at least 40% of the fibrils are aligned principally in one direction.

22. The thermoelectric material of claim 13 wherein at least 70% of the fibrils are aligned principally in one direction.

23. The thermoelectric material of claim 13 wherein at least 90% of the fibrils are aligned principally in one direction.

\* \* \* \* \*